(12) United States Patent
Li et al.

(10) Patent No.: US 11,392,007 B2
(45) Date of Patent: *Jul. 19, 2022

(54) DISPLAY APPARATUS WITH A MICRO LITE-EMMITTING DIODE PANEL OVERLAPPED WITH A REFLECTIVE DISPLAY PANEL

(71) Applicant: PlayNitride Display Co., Ltd., MiaoLi County (TW)

(72) Inventors: Yun-Li Li, MiaoLi County (TW); Kuan-Yung Liao, MiaoLi County (TW)

(73) Assignee: PlayNitride Display Co., Ltd., MiaoLi County (TW)

(*) Notice: Subject to any disclaimer, the term of this patent is extended or adjusted under 35 U.S.C. 154(b) by 0 days.

This patent is subject to a terminal disclaimer.

(21) Appl. No.: 16/899,590

(22) Filed: Jun. 12, 2020

(65) Prior Publication Data
US 2020/0393734 A1 Dec. 17, 2020

Related U.S. Application Data

(60) Provisional application No. 62/862,652, filed on Jun. 17, 2019.

(30) Foreign Application Priority Data

Oct. 22, 2019 (TW) .................. 108138040

(51) Int. Cl.
*G02F 1/167* (2019.01)
*G02F 1/1677* (2019.01)
(Continued)

(52) U.S. Cl.
CPC ........ *G02F 1/1677* (2019.01); *G02F 1/13338* (2013.01); *G02F 1/167* (2013.01);
(Continued)

(58) Field of Classification Search
CPC ......... G02F 1/167; G02F 1/1677; G09G 3/32; G09G 3/3406; G09G 3/344;
(Continued)

(56) References Cited

U.S. PATENT DOCUMENTS 6,448,710 B1  9/2002 Asai et al.
10,627,694 B1* 4/2020 Wang .................. H01L 27/3211
(Continued)

FOREIGN PATENT DOCUMENTS

CN   1885099   12/2006
CN   101004505  7/2007
(Continued)

OTHER PUBLICATIONS

"Office Action of China Counterpart Application", dated Mar. 16, 2021, pp. 1-11.
(Continued)

*Primary Examiner* — Liliana Cerullo
(74) *Attorney, Agent, or Firm* — JCIPRNET

(57) ABSTRACT

A display apparatus including a reflective display panel and a micro light-emitting diode panel is provided. The display apparatus has a display surface and the reflective display panel has a reflective surface. The micro light-emitting diode panel is overlapped with the reflective display panel and includes a driving circuit layer and a plurality of light-emitting diode devices. The driving circuit layer is positioned between the reflective display panel and the display surface. The micro light-emitting diode devices are electrically bonded to the driving circuit layer. The display surface and the reflective surface are respectively disposed on two opposite sides of the micro light-emitting diode devices and the transmittance of the micro light-emitting diode panel within a wavelength range of visible light is higher than 50%.

15 Claims, 11 Drawing Sheets

(51) Int. Cl.
  *G02F 1/1333* (2006.01)
  *G09G 3/34* (2006.01)
  *G09G 3/32* (2016.01)

(52) U.S. Cl.
  CPC .............. *G09G 3/32* (2013.01); *G09G 3/344* (2013.01); *G09G 3/3406* (2013.01); *G09G 2300/0421* (2013.01); *G09G 2300/0456* (2013.01); *G09G 2320/062* (2013.01); *G09G 2320/0626* (2013.01); *G09G 2360/144* (2013.01)

(58) Field of Classification Search
  CPC ... G09G 2300/0421; G09G 2300/0456; G09G 2320/062
  See application file for complete search history.

(56) References Cited

U.S. PATENT DOCUMENTS

| | | | |
|---|---|---|---|
| 11,163,192 B2 * | 11/2021 | Li | H01L 33/62 |
| 2002/0190332 A1 | 12/2002 | Lee et al. | |
| 2004/0164292 A1 | 8/2004 | Tung et al. | |
| 2013/0044276 A1 | 2/2013 | Lee et al. | |
| 2016/0005353 A1 * | 1/2016 | Bennett | G09G 3/3446 345/206 |
| 2017/0068362 A1 * | 3/2017 | Den Boer | G06F 3/0446 |
| 2017/0309678 A1 | 10/2017 | Yang et al. | |
| 2018/0031943 A1 * | 2/2018 | Yamazaki | G02B 26/04 |
| 2018/0277591 A1 | 9/2018 | Wu et al. | |
| 2020/0393724 A1 * | 12/2020 | Li | G02F 1/167 |

FOREIGN PATENT DOCUMENTS

| | | |
|---|---|---|
| CN | 101859714 | 10/2010 |
| CN | 102738171 | 10/2012 |
| CN | 105976725 | 9/2016 |
| CN | 205992531 | 3/2017 |
| CN | 107664837 | 2/2018 |
| CN | 107680989 | 2/2018 |
| CN | 108877538 | 11/2018 |
| CN | 109216516 | 1/2019 |
| CN | 109273482 | 1/2019 |
| CN | 109755266 | 5/2019 |
| EP | 1279996 | 1/2003 |
| JP | 2008258214 | 10/2008 |
| TW | 201502609 | 1/2015 |
| TW | 201606740 | 2/2016 |
| TW | 201819967 | 6/2018 |
| TW | M568391 | 10/2018 |
| WO | 2018176524 | 10/2018 |
| WO | 2018223988 | 12/2018 |

OTHER PUBLICATIONS

"Office Action of China Counterpart Application", dated Mar. 17, 2022, p. 1-p. 11.

* cited by examiner

DISPLAY APPARATUS WITH A MICRO LITE-EMMITTING DIODE PANEL OVERLAPPED WITH A REFLECTIVE DISPLAY PANEL

CROSS-REFERENCE TO RELATED APPLICATION

This application claims the priority benefit of U.S. provisional application Ser. No. 62/862,652, filed on Jun. 17, 2019, and Taiwan application no. 108138040, filed on Oct. 22, 2019. The entirety of the above-mentioned patent application is hereby incorporated by reference herein and made a part of this specification.

BACKGROUND

Technical Field

The disclosure relates to a display apparatus, and particularly relates to a display apparatus having light-emitting diode (LED) devices.

Description of Related Art

As display technology continues advancing, not only the display performance, such as resolution, contrast, frame rate, etc., of display apparatuses is greatly improved, display apparatuses are also developed to be thinner, lighter, flexible, and frameless in order to satisfy consumers who have higher demand for visual effects, storability and portability. A reflective display displays an image by reflecting external environmental light, which eliminates the need for a light source module and helps to improve the compactness and portability of the reflective display. Because of the advantage of low power consumption, the reflective display is widely used in electronic paper, e-books or electronic billboards.

However, the reflective display requires the external light source to generate a display image and the display quality is more susceptible to how the external environmental light is emitted or where the viewer is. Thus, the reflective display may not be convenient to use. For example, in a slightly dim place, the image displayed by the reflective display may be unclear due to insufficient environmental light; or in a place where the environmental light has higher directivity, the viewing angle may be limited. In other words, the reflective display has poor adaptability to the environment where it is operated. How to solve the above problems has become an important issue for related manufacturers.

SUMMARY

The disclosure is directed to a display apparatus with a power saving function, which has good display quality and operating adaptability.

The disclosure provides a display apparatus having a display surface, and includes a reflective display panel and a micro light-emitting diode panel. The reflective display panel has a reflective surface. The micro light-emitting diode panel is overlapped with the reflective display panel and includes a driving circuit layer and a plurality of micro light-emitting diode devices. The driving circuit layer is positioned between the reflective display panel and the display surface. The micro light-emitting diode devices are electrically bonded to the driving circuit layer. The display surface and the reflective surface are respectively disposed on two opposite sides of the micro light-emitting diode devices and a visible light transmittance of the micro light-emitting diode panel is higher than 50%.

In an embodiment of the disclosure, the reflective display panel of the display apparatus includes a plurality of pixel structures. A first spacing is present between any two adjacent micro light-emitting diode devices, a second spacing is present between any two adjacent pixel structures, and the first spacing is a multiple of the second spacing.

In an embodiment of the disclosure, the reflective display panel of the display apparatus includes a plurality of pixel structures overlapped with the micro light-emitting diode panel, and the pixel structures are staggered with the micro light-emitting diode devices in a normal direction of the display surface.

In an embodiment of the disclosure, the micro light-emitting diode panel of the display apparatus further includes a plurality of pixels. The pixels respectively have at least one micro light-emitting diode device. The number of the pixel structures of the reflective display panel is different to the number of the pixels of the micro light-emitting diode panel.

In an embodiment of the disclosure, the number of the pixel structures of the reflective display panel of the display apparatus is more than the number of the pixels of the micro light-emitting diode panel.

In an embodiment of the disclosure, each of the pixels of the display apparatus has a red micro light-emitting diode, a blue micro light-emitting diode and a green micro light-emitting diode.

In an embodiment of the disclosure, the micro light-emitting diode panel of the display apparatus further includes a plurality of dimming patterns. The dimming patterns are overlapped with the micro light-emitting diode devices, and the micro light-emitting diode devices are located between the reflective display panel and the dimming patterns.

In an embodiment of the disclosure, the driving circuit layer of the display apparatus includes a plurality of connection pads overlapped with the micro light-emitting diode devices. The micro light-emitting diode devices are bonded to the connection pads, and the connection pads are the dimming patterns.

In an embodiment of the disclosure, the display apparatus further includes a touch device layer. The touch device layer is overlapped with the reflective display panel and the micro light-emitting diode panel, and the micro light-emitting diode panel is located between the touch device layer and the reflective display panel.

In an embodiment of the disclosure, the display apparatus further includes a touch device layer disposed between the display surface and the micro light-emitting diode devices. The touch device layer includes a driving electrode and a sensing electrode.

In an embodiment of the disclosure, the micro light-emitting diode panel of the display apparatus further includes a substrate. The touch device layer is disposed on a first surface of the substrate, and the driving circuit layer is located on the touch device layer.

In an embodiment of the disclosure, the substrate of the micro light-emitting diode panel of the display apparatus is configured with the display surface, and the display surface is opposite to the first surface.

In an embodiment of the disclosure, the micro light-emitting diode panel of the display apparatus further includes a substrate. The driving circuit layer is disposed on a first surface of the substrate. The micro light-emitting diode devices are bonded to the driving circuit layer, and the substrate and the driving circuit layer are located between the reflective display panel and the micro light-emitting diode devices.

In an embodiment of the disclosure, the micro light-emitting diode panel of the display apparatus further includes a plurality of dimming patterns. The dimming patterns are overlapped with the micro light-emitting diode devices, and the micro light-emitting diode devices are located between the reflective display panel and the dimming patterns.

In an embodiment of the disclosure, the micro light-emitting diode panel provides a light source to the reflective display panel in a light source mode. The micro light-emitting diode panel serves as a display panel in a display mode.

In an embodiment of the disclosure, the micro light-emitting diode panel and the reflective display panel respectively display different images in a hybrid mode.

Based on the above description, in the display apparatus of an embodiment of the disclosure, the flexibility of operation of the reflective display panel is increased because of the configuration relationship between the micro light-emitting diode panel and the reflective display panel, which helps to improve the operational adaptability of the display apparatus in different situations. Furthermore, as the transmittance of the light-emitting diode panel is greater than 50%, the light energy loss of the external environmental light and the light beam reflected by the reflective display panel after passing through the micro LED panel is effectively reduced, thereby increasing the light energy utilization rate of the display apparatus and improving the overall display quality.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF THE EMBODIMENTS

Figure 1:
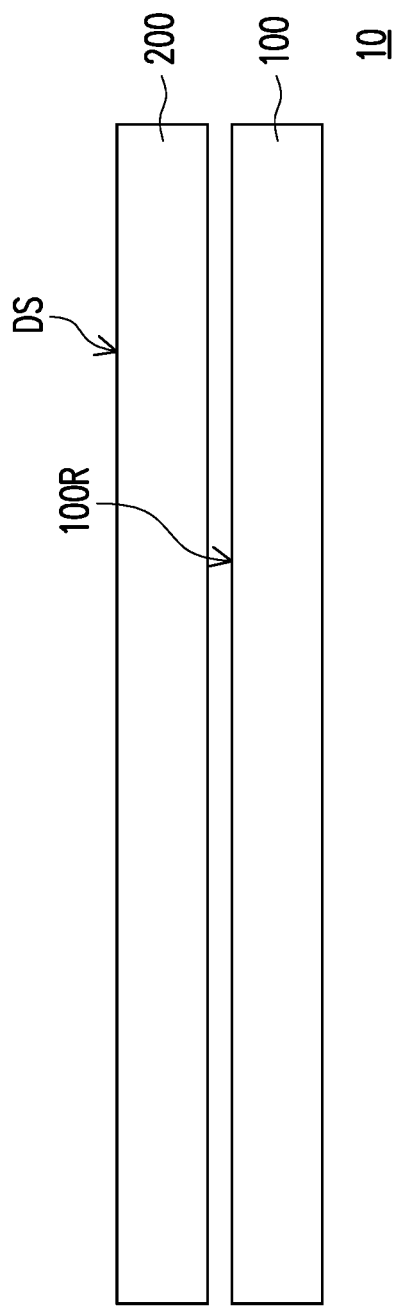
FIG. 1 is a schematic diagram of a display apparatus according to a first embodiment of the disclosure.

In the accompanying drawings, for clarity's sake, the thickness of layers, films, panels, regions, etc., is enlarged. It should be understood that when a device such as a layer, a film, a region, or a substrate is referred to as "on" or "connected" to another device, it may be directly on or connected to the other device, or other devices probably exist there between. Comparatively, when the device is referred to be "directly on" or "directly coupled" to another device, none other device exits there between. The "connection" used herein may refer to both physical and/or electrical connections. Furthermore, "electrical connection" may refer to that that there are other elements between the two elements.

Reference will now be made in detail to the present exemplary embodiments of the disclosure, examples of which are illustrated in the accompanying drawings. Wherever possible, the same reference numbers are used in the drawings and the description to refer to the same or like parts.

Figure 2A:
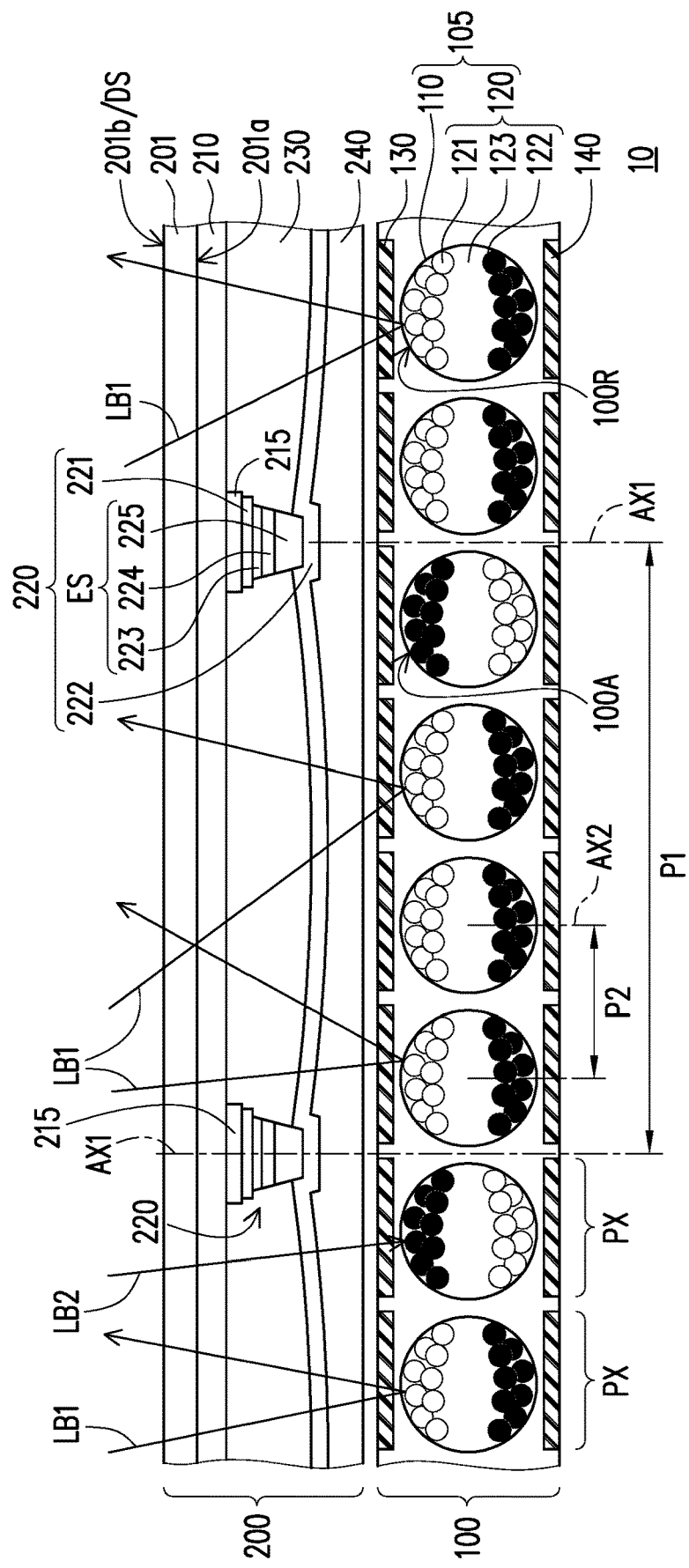
FIG. 2A to FIG. 2C are cross-sectional views of a part of regions of the display apparatus of FIG. 1 operated in different operation modes.
Figure 2B:
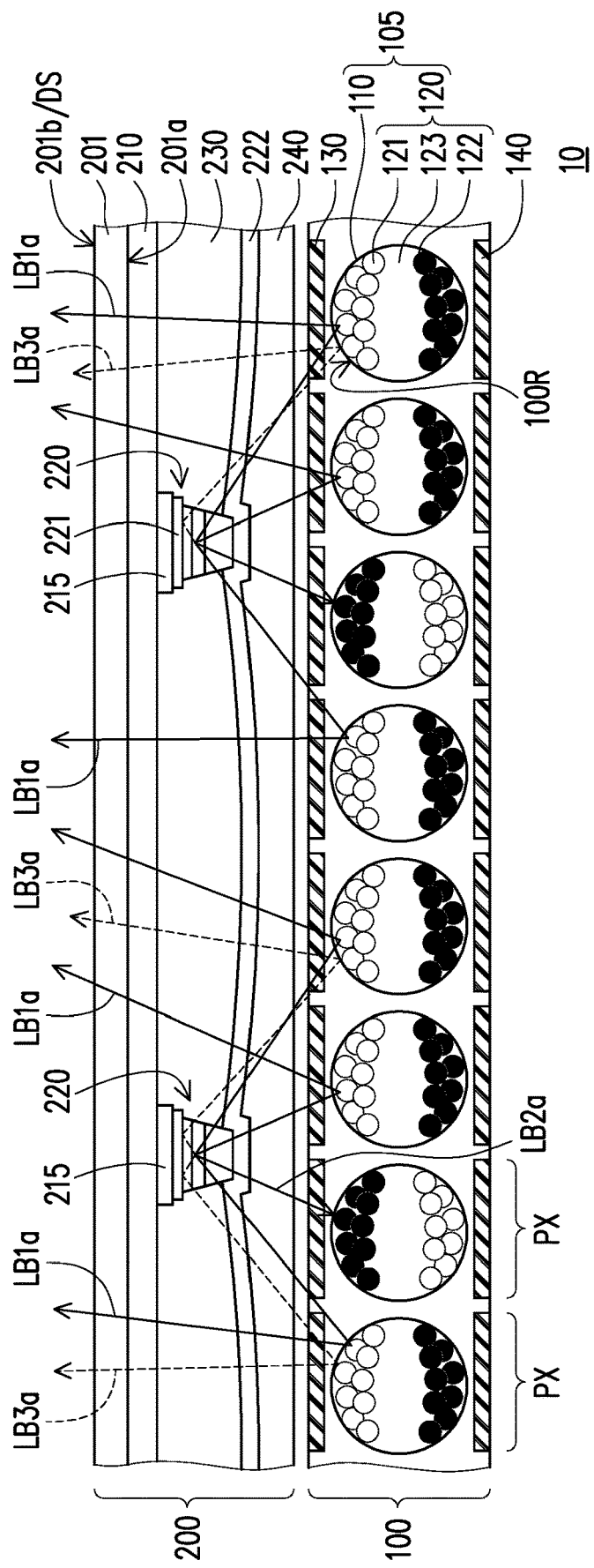
Figure 2C:
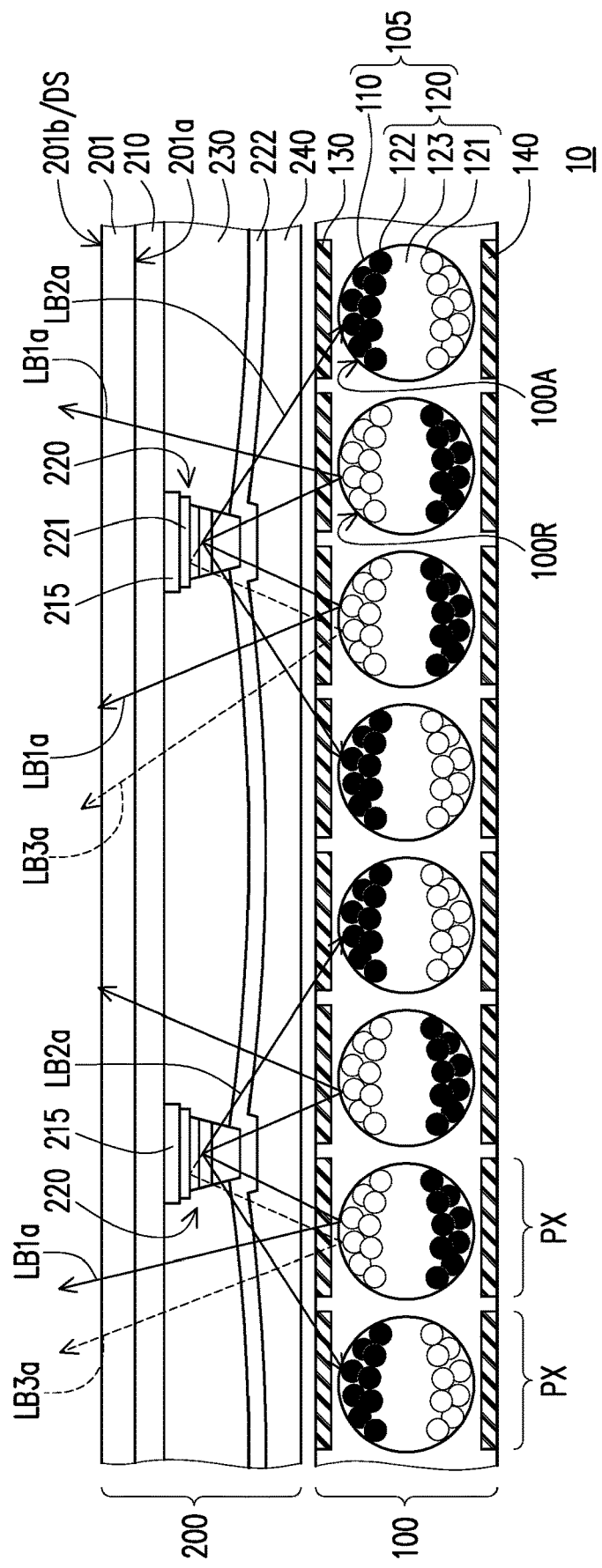
Figure 3:
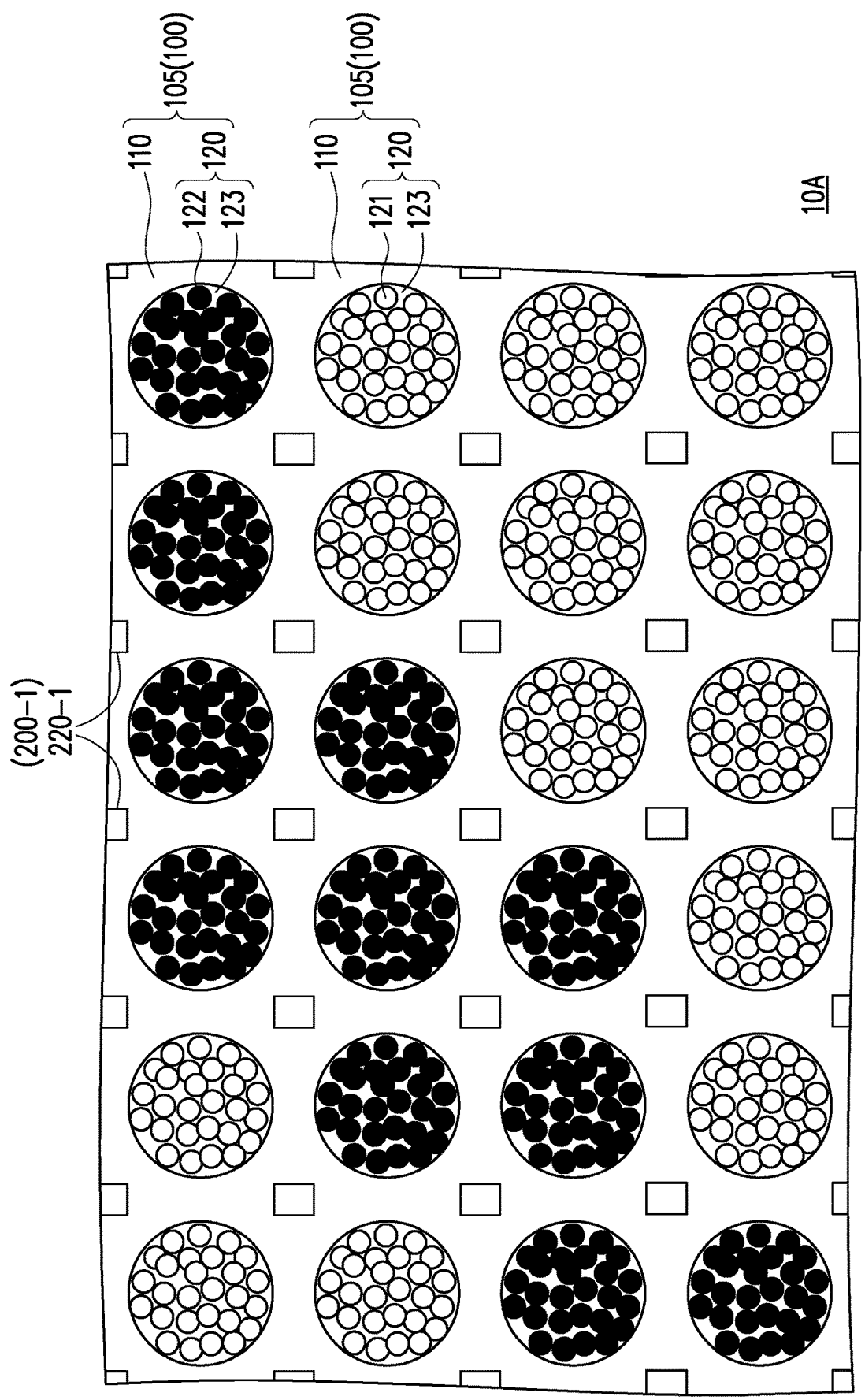
FIG. 3 is a top view of a display apparatus according to a second embodiment of the disclosure.

FIG. 1 is a schematic diagram of a display apparatus according to a first embodiment of the disclosure. FIG. 2A to FIG. 2C are cross-sectional views of a part of regions of the display apparatus of FIG. 1 operated in different operation modes. FIG. 3 is a top view of a display apparatus according to a second embodiment of the disclosure. Particularly, for clarity's sake, FIG. 3 only illustrates a display medium layer 105 and a micro Light-Emitting Diode (LED) device 220-1 of the display apparatus 10A.

Referring to FIG. 1, the display apparatus 10 includes a reflective display panel 100 and a micro LED panel 200. In the embodiment, the reflective display panel 100 is, for example, an Electrophoretic Display (EPD) panel, but the disclosure is not limited thereto. In other embodiments, the reflective display panel may also be a Cholesteric Liquid Crystal (CLC) panel, a reflective LCD panel, an Electrowetting Display (EWD) panel or a Quick Response-Liquid Powder Display (QR-LPD) panel.

It should be noted that the display apparatus 10 may have a plurality of operation modes, which may be divided into a light source mode, a display mode and a hybrid mode according to the operating function of the micro LED panel 200. For example, the micro LED panel 200 provides a light source to the reflective display panel 100 in the light source mode; and the micro LED panel 200 is a display panel in the display mode. However, the disclosure is not limited thereto, and in other embodiments, the reflective display panel and the micro LED panel respectively display different images in the hybrid mode. On the other hand, when the micro LED panel 200 is not enabled, the display apparatus 10 may present a display image of the reflective display panel 100 with use of illumination of external environmental light.

An adhesive layer (not shown) may be selectively disposed between the reflective display panel 100 and the micro LED panel 200 to connect the reflective display panel 100 and the micro LED panel 200. For example, the adhesive layer may be a Pressure Sensitive Adhesive (PSA), an Optically Clear Adhesive (OCA), a photosensitive water adhesive (a UV adhesive), or an Optical Clear Resin (OCR). In the embodiment, the adhesive layer may be integrally overlapped on the reflective display panel 100 and the micro LED panel 200. Namely, the reflective display panel 100 and the micro LED panel 200 may be bonded in a direct bonding manner. It should be noted that the bonding method of the two panels is not limited by the disclosure. For example, the reflective display panel 100 may also be connected to the micro LED panel 200 through other suitable components, such as a frame assembly.

Further, the reflective display panel 100 has a reflective surface 100R, and the micro LED panel 200 is overlapped on the side of the reflective display panel 100 provided with the reflective surface 100R. To be specific, the external environmental light may penetrate through the micro LED panel 200 and reach the reflective surface 100R of the reflective display panel 100. Then, the external environmental light is reflected by the reflective surface 100R and again passes through the micro LED panel 200, and is emitted out of the display apparatus 10 through a display surface DS, thereby displaying an image that is to be presented by the reflective display panel 100. It should be noted that as a visible light transmittance of the micro LED panel 200 is greater than 50%, the light energy loss of the external environmental light after passing through the LED panel is effectively reduced, which increases the light energy utilization of the display apparatus 10 and improves the overall display quality.

Referring to FIG. 2A, in the embodiment, the micro LED panel 200 includes a substrate 201, a driving circuit layer 210 and a plurality of micro LED devices 220. The substrate 201 has a first surface 201a and a second surface 201b opposite to each other, and the first surface 201a faces the reflective surface 100R of the reflective display panel 100, and the second surface 201b may define the display surface DS of the display apparatus 10. The driving circuit layer 210 is disposed on the first surface 201a of the substrate 201, and has a plurality of connection pads 215. The micro LED devices 220 are disposed on the driving circuit layer 210, and are respectively and electrically bonded to the connection pads 215. In other words, the display surface DS and the reflective surface 100R are respectively located at two opposite sides of the micro LED devices 220.

For example, each of the micro LED devices 220 includes an epitaxial structure ES, a first electrode 221 and a second electrode 222. In the embodiment, the first electrode 221 and the second electrode 222 may be respectively disposed at two opposite sides of the epitaxial structure ES, and electrically connected to the epitaxial structure ES. Namely, the micro LED devices 220 of the embodiment may be vertical type LEDs. However, the disclosure is not limited thereto, and in other embodiments, the LED devices may also be flip-chip type or lateral type LEDs according to an actual design requirement. Such type of the LED device may further selectively include an insulation layer, and the first electrode and the second electrode located at the same side of the epitaxial structure penetrate through the insulation layer to electrically connect the epitaxial structure.

To be specific, a vertical projection of the micro LED device 220 of the embodiment on the substrate 201 has a length, and such length is between 3 μm and 60 μm. For example, a length of the vertical type LED device may be between 3 μm and 15 μm, a length of the flip-chip type or lateral type LED device may be between 15 μm and 60 μm. On the other hand, the micro LED device 220 has a thickness in a normal direction of the substrate 201, and such thickness is between 5 μm and 10 μm.

Furthermore, a plurality of the LED devices 220 may define a plurality of pixels of the micro LED panel 200. In the embodiment, each of the micro LED devices 220 may be defined as a pixel of the micro LED panel 200, but the disclosure is not limited thereto. In other embodiments, the number of the micro LED devices 220 contained in each pixel of the micro LED panel may also be two or more. For example, in an embodiment, each pixel contains three micro LEDs, which are respectively a red micro LED, a blue micro LED and a green micro LED.

On the other hand, the micro LED devices 220 are electrically connected to the driving circuit layer 210 through the connection pads 215. In the embodiment, the micro LED panel 200 may further include a planarization layer 230 covering the epitaxial structure ES, and a plurality of second electrodes 222 of a plurality of micro LED devices 220 extend on the planarization layer 230 and connect with each other to form a common electrode, but the disclosure is not limited thereto. A material of the planarization layer includes inorganic material (for example, silicon oxide, silicon nitride, silicon oxynitride, spin on glass, other proper materials, or a stacked layer of at least two of the above materials), organic material, other proper materials, or a combination of the above materials.

The epitaxial structure ES may include a first type semiconductor layer 223, a light-emitting layer 224 and a second type semiconductor layer 225. The first type semiconductor layer 223 and the second type semiconductor layer 225 are respectively located at two opposite sides of the light-emitting layer 224, and electrically connected to the first electrode 221 and the second electrode 222, respectively. In the embodiment, the first type semiconductor layer 223 is, for example, a P-type semiconductor, the second type semiconductor layer 225 is, for example, an N-type semiconductor, and the light-emitting layer 224 may be a Multiple Quantum Well (MWQ) layer, but the disclosure is not limited thereto.

For example, when the micro LED panel 200 is enabled, the first electrode 221 may have a high potential, and the second electrode 222 may have a ground potential or a low potential. A current generated through a potential difference between the first electrode 221 and the second electrode 222 may enable the corresponding epitaxial structure ES to emit a (visible) light beam. To be specific, the micro LED panel 200 may implement control through an active device of the driving circuit layer 210, for example, to make the plurality of first electrodes 221 to respectively have substantially the same high potential, so that the epitaxial structures ES emit light beams having substantially the same intensity, thereby forming a uniform illumination light source; or to make the plurality of first electrodes 221 to respectively have different high potentials, so that the epitaxial structures ES emit light beams with different intensities due to the respective different driving currents, thereby forming an image adapted to be viewed by human eyes.

In the embodiment, the first electrode 221 and the second electrode 222 are, for example, light transmissive electrodes, and a material of the light transmissive electrode includes metal oxide, for example, indium tin oxide, indium zinc oxide, aluminum tin oxide, aluminum zinc oxide, or other suitable oxide, or a stacked layer of at least two of the above materials. However, the disclosure is not limited thereto, and in other embodiments, the first electrode 221 may also be a reflective electrode, and a material of the reflective electrode includes metal, alloy, nitride of a metal material, oxide of a metal material, oxynitride of a metal material, or other suitable material, or a stacked layer of a metal material and other conductive materials.

In the embodiment, the micro LED device 220 may selectively include a packaging layer 240, which covers the second electrode 222 of the micro LED device 220. A material of the packaging layer 240 may include silicon nitride, aluminum oxide, aluminum oxynitride, silicon oxynitride, acrylic resin, hexamethyldisiloxane (HMDSO), or glass.

Further, the reflective display panel 100 may include a display medium layer 105 overlapped with the display surface DS and a plurality of third electrodes 130 and a plurality of fourth electrodes 140. The third electrodes 130 and the fourth electrodes 140 are respectively located at two opposite sides of the display medium layer 105. For example, the display medium layer 105 may include a plurality of microcapsules 110 and electronic ink 120 filled in the microcapsules 110. The microcapsules 110 may respectively correspond to a plurality of third electrodes 130 (or fourth electrodes 140). The electronic ink 120 may selectively include a plurality of white particles 121, a plurality of black particles 122 and a transparent fluid 123. The white particles 121 and the black particles 122 may have one positively charged and the other negatively charged. However, the disclosure is not limited thereto, and in some embodiments, the electronic ink may also contain a plurality of charged particles of different colors.

Particularly, the microcapsules 110, the electronic ink 120 and the corresponding third electrodes 130 and fourth electrodes 140 may define pixel structures PX of the reflective display panel 100. In the embodiment, the number of the pixel structures PX of the reflective display panel 100 may be selectively different to the number of pixels of the micro LED panel 200. For example, the number of the pixel structures PX of the reflective display panel 100 may be more than the number of pixels of the micro LED panel 200, but the disclosure is not limited thereto. In other embodiments, the number of pixel structures of the reflective display panel may be substantially equal to the number of pixels of the micro LED panel.

When the reflective display panel 100 is enabled, one of the third electrode 130 and the fourth electrode 140 of each pixel structure PX may have a positive potential, and the other one has a negative potential. For example, when the white particles 121 of the electronic ink 120 are negatively charged, if the third electrode 130 of the pixel structure PX has the positive potential, the white particles 121 may move towards and accumulate at one side of the microcapsule 110 adjacent to the third electrode 130; comparatively, since the fourth electrode 140 of the pixel structure PX has the negative potential, the positively charged black particles 122 may move towards the fourth electrode 140 and accumulate at the side of the microcapsule 110 adjacent to the fourth electrode 140. In this case, one side surface of the microcapsule 110 adjacent to the third electrode 130 may define the reflective surface 100R of the reflective display panel 100. Conversely, when the third electrode 130 of the pixel structure PX has the negative potential, the positively charged black particles 122 may move towards the third electrode 130 and accumulate at one side of the microcapsule 110 adjacent to the third electrode 130; at this time, one side of the microcapsule 110 of the pixel structure PX adjacent to the third electrode 130 may define an absorptive surface 100A of the reflective display panel 100.

In the embodiment, the third electrode 130 and the fourth electrode 140 are, for example, light transmissive electrodes, and a material of the light transmissive electrode includes metal oxide, such as indium tin oxide, indium zinc oxide, aluminum tin oxide, aluminum zinc oxide, or other suitable oxide, or a stacked layer of at least two of the above materials. However, the disclosure is not limited thereto, and in other embodiments, the fourth electrode 140 may also be a reflective electrode, and a material of the reflective electrode includes metal, alloy, nitride of a metal material, oxide of a metal material, oxynitride of a metal material, or other suitable material, or a stacked layer of a metal material and other conductive materials.

Furthermore, the micro LED device 220 and the pixel structure PX respectively have a central axis AX1 and a central axis AX2. In the embodiment, a plurality of central axes AX1 of the plurality of micro LED devices 220 are staggered with a plurality of central axes AX2 of the plurality of pixel structures PX in a normal direction of the display surface DS (i.e. the second surface 201b). In this way, Moiré produced by visual superimposing of periodic structures of the two panels may be mitigated. However, the disclosure is not limited thereto. In other embodiments, the plurality of central axes AX1 of the plurality of micro LED devices 220 may also be coincided with the plurality of central axes AX2 of the pixel structures PX. Namely, the micro LED devices 220 may be aligned with the corresponding pixel structures PX.

On the other hand, a first spacing P1 is present between any two adjacent micro LED devices 220 (i.e. the central axes AX1) of the micro LED panel 200, and a second spacing P2 is present between any two adjacent pixel structures PX (i.e. the central axes AX2) of the reflective display panel 100, and the first spacing P1 is a multiple of the second spacing P2. For example, in the embodiment, the first spacing P1 of the plurality of micro LED devices 220 is four times of the second spacing P2 of the plurality of pixel structure PX. However, the disclosure is not limited thereto, and in other embodiments, the multiple relationship between the first spacing P1 of the plurality of micro LED devices 220 and the second spacing P2 of the plurality of pixel structures PX may also be adjusted to double, triple, or more than five times according to actual design requirements (for example, a size of an illumination area, a resolution of the LED panel, or a viewing angle requirements of the display apparatus).

A plurality of operation modes of the display apparatus 10 is described below. Referring to FIG. 2A, when an operation environment of the display apparatus 10 is relatively bright, only the reflective display panel 100 is enabled to form the reflective surface 100R (or the absorptive surface 100A) corresponding to a display image, and a corresponding image beam adapted to be viewed by human eyes is formed with use of illumination of the external environmental light. For example, the external environmental light source may provide a plurality of light beams. For example, when a light beam LB1 enters the micro LED panel 200 and is transmitted to the display medium layer 105 of the reflective display panel 100, the light beam LB1 may be reflected by a plurality of white particles 121 in the electronic ink 120 of one pixel structure PX that are accumulated at one side of the microcapsule 110 adjacent to the third electrode 130 to form a corresponding image beam; and when another light beam LB2 is transmitted to another pixel structure PX, the light beam LB2 may be absorbed by a plurality of black particles 122 in the electronic ink 120 of the pixel structure PX that are accumulated at one side of the microcapsule 110 adjacent to the third electrode 130 and cannot emit out of the reflective display panel 100. It should be noted that since the transmittance of the micro LED panel 200 is greater than 50%, the light energy loss of the light beam after passing through the micro LED panel 200 is effectively reduced, which increases the light energy utilization of the display apparatus 10 and improves the overall display quality.

Referring to FIG. 2B, when the operation environment of the display apparatus 10 is relatively dim or directivity of the external environmental light is relatively high, in order to increase image visibility of the reflective display panel 100, the micro LED panel 200 may be enabled for the use as an auxiliary light source. Namely, in a light source mode, the micro LED panel 200 provides a light source to the reflective display panel 100. For example, when a light beam LB1a emitted by the micro LED device 220 is transmitted to the display medium layer 105 of the reflective display panel 100, the light beam LB1a may be reflected by a plurality of white particles 121 in the electronic ink 120 of one pixel structure PX that are accumulated at one side of the microcapsule 110 adjacent to the third electrode 130 to form a corresponding image beam; and when another light beam LB2a is transmitted to another pixel structure PX, the light beam LB2a may be absorbed by a plurality of black particles 122 in the electronic ink 120 of the pixel structure PX that are accumulated at one side of the microcapsule 110 adjacent to the third electrode 130 and cannot emit out of the reflective display panel 100.

It should be noted that since the first electrode 221 of the embodiment is a reflective electrode, a light beam LB3a emitted by the micro LED device 220 toward the first electrode 221 may be reflected to the display medium layer 105 to form an image beam (or absorbed). On the other hand, when the micro LED panel 200 serves as the auxiliary light source, light beam intensities provided by the plurality of micro LED devices 220 are substantially the same, but the disclosure is not limited thereto. In other embodiments, the plurality of micro LED devices 220 may also respectively provide illumination beams of different intensities according to a pixel gray scale distribution of the reflective display panel 100, so as to achieve a local dimming effect to improve a (dynamic) contrast performance of the display apparatus.

Further, when the micro LED panel 200 of the display apparatus 10 serves as a display panel, the pixel structures PX within partial regions where the reflective display panel 100 overlaps with the micro LED devices 220 may define the reflective surface 100R of the reflective display panel 100 (i.e. the partial regions are reflective regions of the reflective display panel 100), and the pixel structures PX outside the partial regions define the absorptive surface 100A of the reflective display panel 100, as shown in FIG. 2C. In other words, when the micro LED panel 200 serves as the display panel, the reflective display panel 100 may have a plurality of reflective regions and a plurality of absorptive regions, and the reflective regions and the absorptive regions are arranged in alternation.

Based on the above description, the plurality of LED devices 220 may emit light beams (i.e. image beams) of different intensities, and the light beams are respectively reflected by the plurality of reflective regions of the reflective display panel 100 and transmitted to the user to form a display image. In the embodiment, the partial regions of the reflective display panel 100 corresponding to the micro LED devices 220 may be configured with two pixel structures PX, but the disclosure is not limited thereto. In other embodiments, the number of the pixel structures PX in the partial regions may also be adjusted according to an actual design requirement (for example, a resolution of the reflective display panel or a viewing angle range of the display apparatus).

Particularly, since an arrangement spacing of the micro LED devices 220 is larger than an arrangement spacing of the pixel structures PX, a display resolution of the micro LED panel 200 may be smaller than a display resolution of the reflective display panel 100 to meet the minimum display requirement, but the disclosure is not limited thereto. In other embodiments, as shown in FIG. 3, any two adjacent microcapsules 110 of the reflective display panel 100 are configured with at least one micro LED device 220-1. Namely, the display resolution of the micro LED panel 200-1 of the display apparatus 10A may be substantially equal to the display resolution of the reflective display panel, or greater than the display resolution of the reflective display panel 100.

Some other embodiments are provided below to describe the disclosure in detail, where the same reference numbers denote the same or like components, and descriptions of the same technical contents are omitted. The aforementioned embodiment may be referred for descriptions of the omitted parts, and detailed descriptions thereof are not repeated in the following embodiment.

Figure 4:
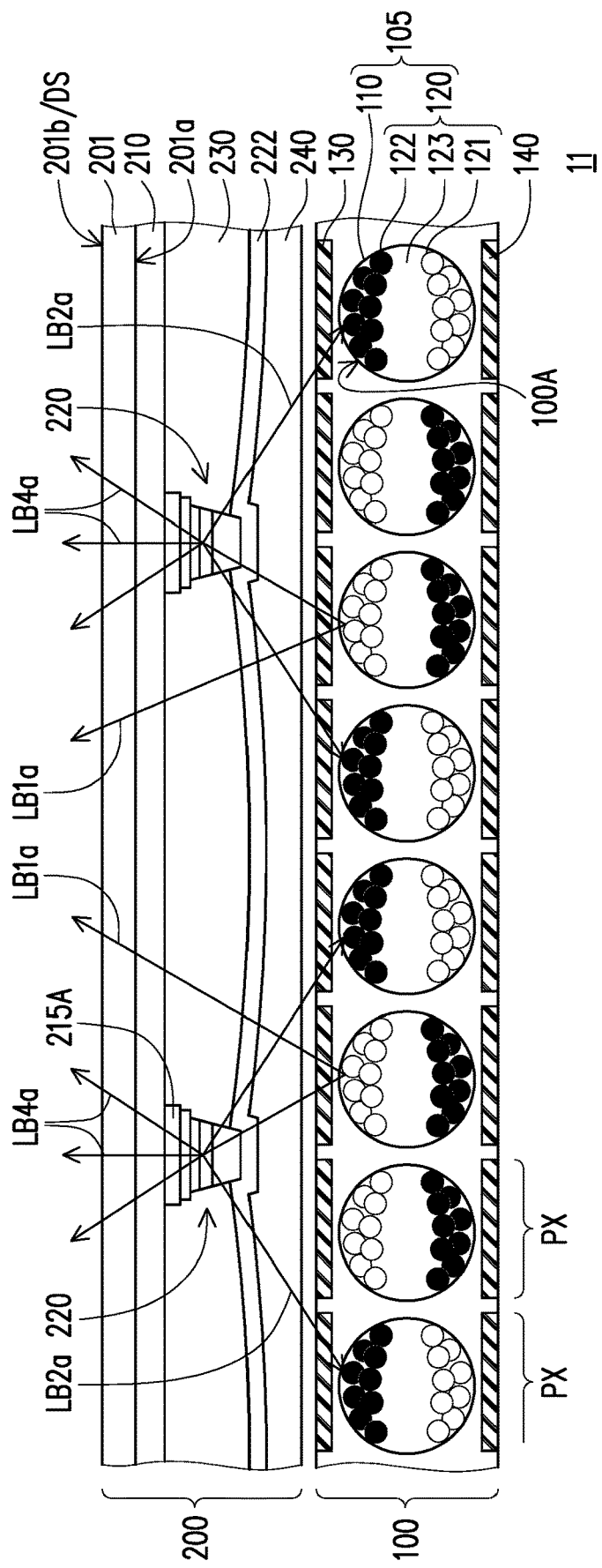
FIG. 4 is a cross-sectional view of a display apparatus according to a third embodiment of the disclosure.

FIG. 4 is a cross-sectional view of a display apparatus according to a third embodiment of the disclosure. Referring to FIG. 4, a main difference between the display apparatus 11 of the embodiment and the display apparatus 10 of FIG. 2C lies in different compositions of the connection pads. In the embodiment, the connection pad 215A of the driving circuit layer 210 may have a specific transparency, for example, a light transmittance of less than 50%. Namely, the connection pads 215A of the embodiment may serve as dimming patterns. To be specific, when the micro LED panel 200A serves as the display panel, light beams LB4a emitted by the micro LED devices 220A towards the connection pads 215A may partially pass through the connection pads 215A and be directly transmitted to the user. In this way, a light energy utilization rate of the micro LED panel 200A used as the display panel may be further increased. Further, the display apparatus 11 may be also operated in a hybrid mode. In this case, the micro LED panel 200A and the reflective display panel 100 respectively display different images (not shown).

It should be noted that when the micro LED panel 200A serves as the illumination light source, the micro LED devices 220A may provide illumination beams with a small output power. Therefore, the light beams LB4a transmitted towards the external are less likely to be perceived by the user after passing through the dimming patterns (i.e., the connection pads 215A), which may decrease visibility of the light source (i.e., the micro LED devices 220A). However, the disclosure is not limited thereto, and in other embodiments that are not shown, the dimming patterns may also be other components different to the connection pads, and the LED devices may be located between the reflective display panel and the dimming patterns.

Figure 5:
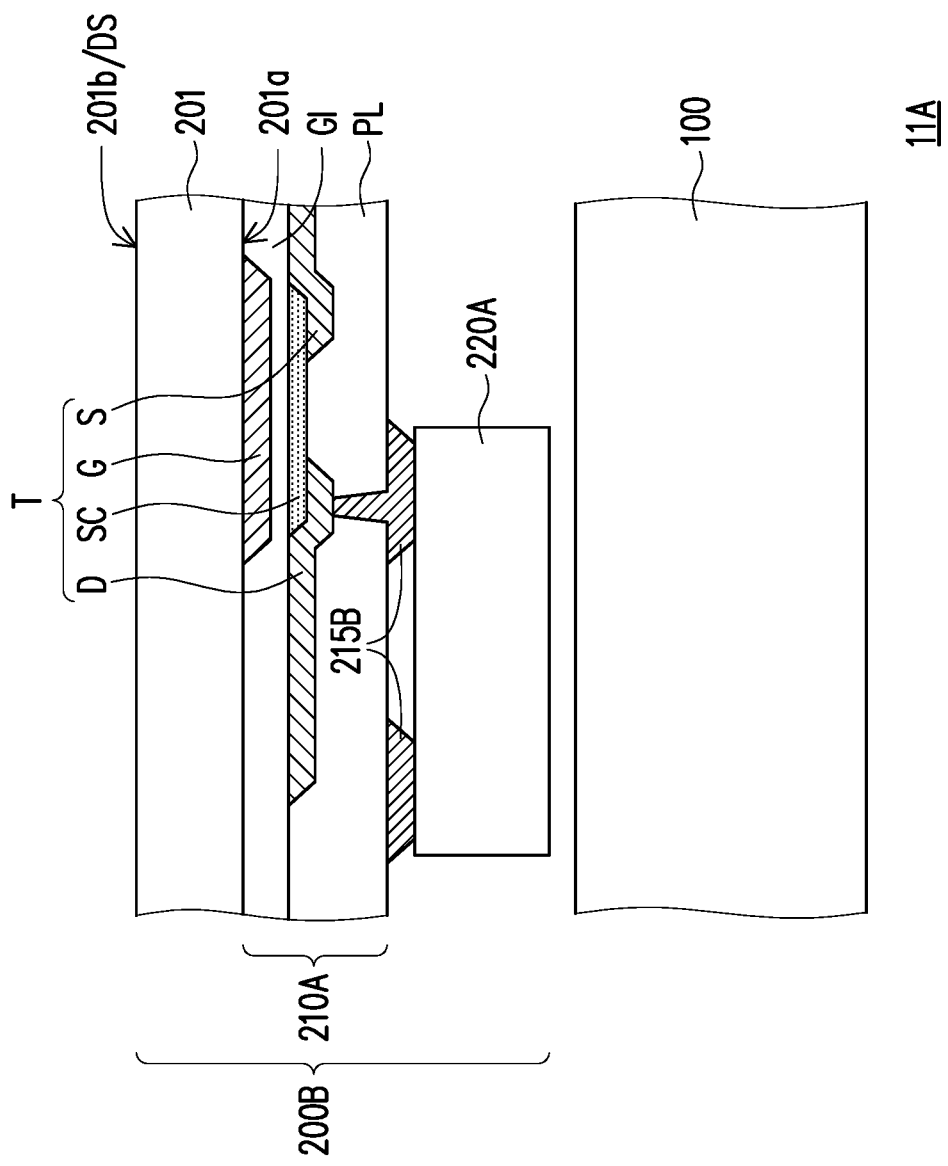
FIG. 5 is a cross-sectional view of a display apparatus according to a fourth embodiment of the disclosure.

FIG. 5 is a cross-sectional view of a display apparatus according to a fourth embodiment of the disclosure. Referring to FIG. 5, a main difference between the display apparatus 11A of the embodiment and the display apparatus 11 of FIG. 4 lies in different types of the micro LED devices and different configurations of the dimming patterns. In the embodiment, the micro LED devices 220 are, for example, lateral type micro LEDs or flip-chip type micro LEDs, and are electrically bonded to the two connection pads 215B of the driving circuit layer 210A.

Further, the driving circuit layer 210A of the micro LED panel 200B has a plurality of active devices T, and a method of forming the active devices T includes sequentially forming a gate G, a gate insulation layer GI, a semiconductor pattern SC, a source S and a drain D, and a planarization layer PL on the first surface 201a of the substrate 201, where one connection pad 215B electrically bonded to the micro LED device 220A penetrates through the planarization layer PL and is electrically connected to the drain D of the active device T. For example, the active device T of the driving circuit layer 210A may be used for controlling a driving current of the micro LED device 220A, but the disclosure is not limited thereto.

It should be noted that the drain D of the active device T and the connection pads 215B of the embodiment may respectively have a specific transparency. Namely, the drain D of the active device T and the connection pads 215B may serve as dimming patterns. However, the disclosure is not limited thereto, and in other embodiments, the source S or the gate G of the active device may also serve as the dimming patterns according to a configuration relationship between the active device and the micro LED device. It should be noted that the gate G, the source S, the drain D, the gate insulation layer GI and the planarization layer PL may be respectively implemented by any gate, any source, any drain, any gate insulation layer and any planarization layer used for the active device array substrate that are well known to those skilled in the art in the related technical field, and the gate G, the source S, the drain D, the gate insulation layer GI and the planarization layer PL may be formed by any method that is well known to those skilled in the art in the related technical field. Therefore, details thereof are not repeated.

Figure 6:
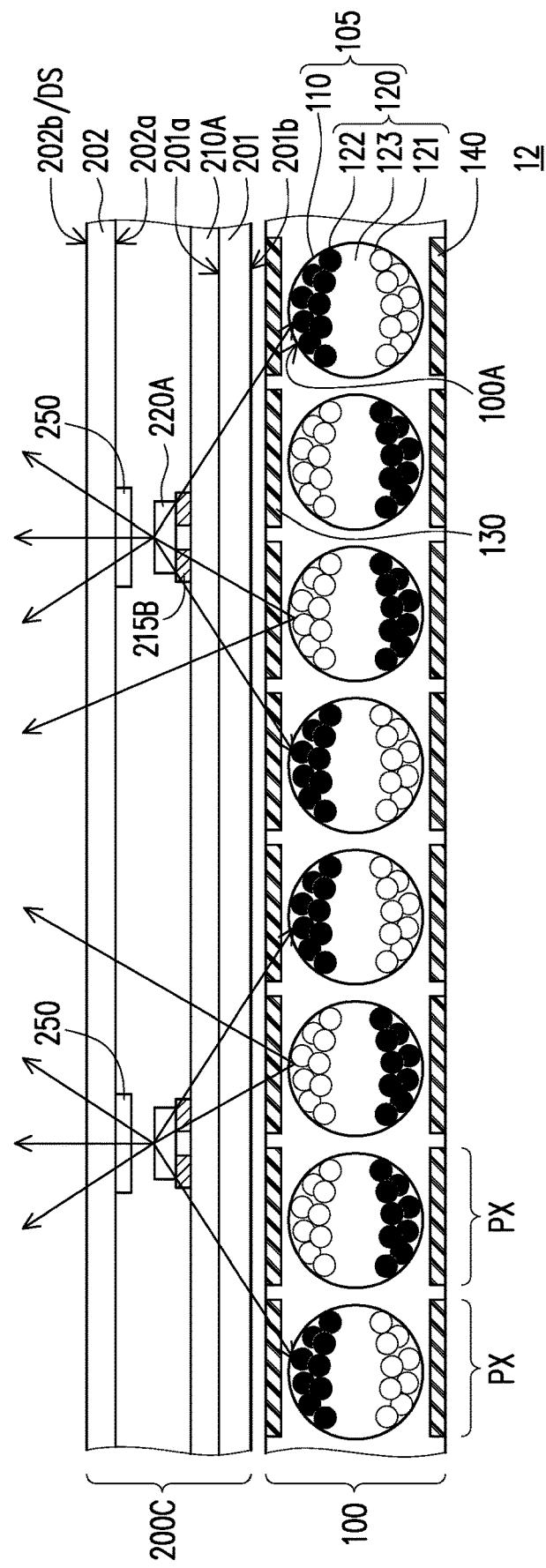
FIG. 6 is a cross-sectional view of a display apparatus according to a fifth embodiment of the disclosure.

FIG. 6 is a cross-sectional view of a display apparatus according to a fifth embodiment of the disclosure. Referring to FIG. 6, a main difference between the display apparatus 12 of the embodiment and the display apparatus 11 of FIG. 4 lies in different compositions and configurations of the micro LED panel. In the embodiment, the micro LED panel 200C further includes a substrate 202 and a plurality of dimming patterns 250. The dimming patterns 250 are disposed on a third surface 202a of the substrate 202, and overlapped with the micro LED devices 220A. The third surface 202a of the substrate 202 faces the reflective display panel 100, and a fourth surface 202b of the substrate 202 opposite to the third surface 202a may define the display surface DS of the display apparatus 12. In other words, the substrate 201 and the driving circuit layer 210A may be located between the reflective display panel 100 and the micro LED devices 220A.

In the embodiment, the micro LED devices 220A are, for example, lateral type micro LEDs or flip-chip type micro LEDs, and are electrically bonded to the two connection pads 215B of the driving circuit layer 210A. In the embodiment, the connection pads 215B and the dimming patterns 250 of the micro LED panel 200C may respectively have a specific transparency. For example, a transparency of the connection pads 215B of the driving circuit layer 210A may be greater than a transparency of the dimming patterns 250, so as to improve a light energy utilization rate of the micro LED panel 200C used as a light source (i.e. the display apparatus 12 is operated in a light source mode). On the other hand, since the type of the micro LED devices 220A of the embodiment is different to the type of the micro LED devices 220 of FIG. 4 (for example, the vertical type micro LEDs), the micro LED panel 200C may not have the planarization layer 230 and the packaging layer 240 shown in FIG. 4.

Figure 7:
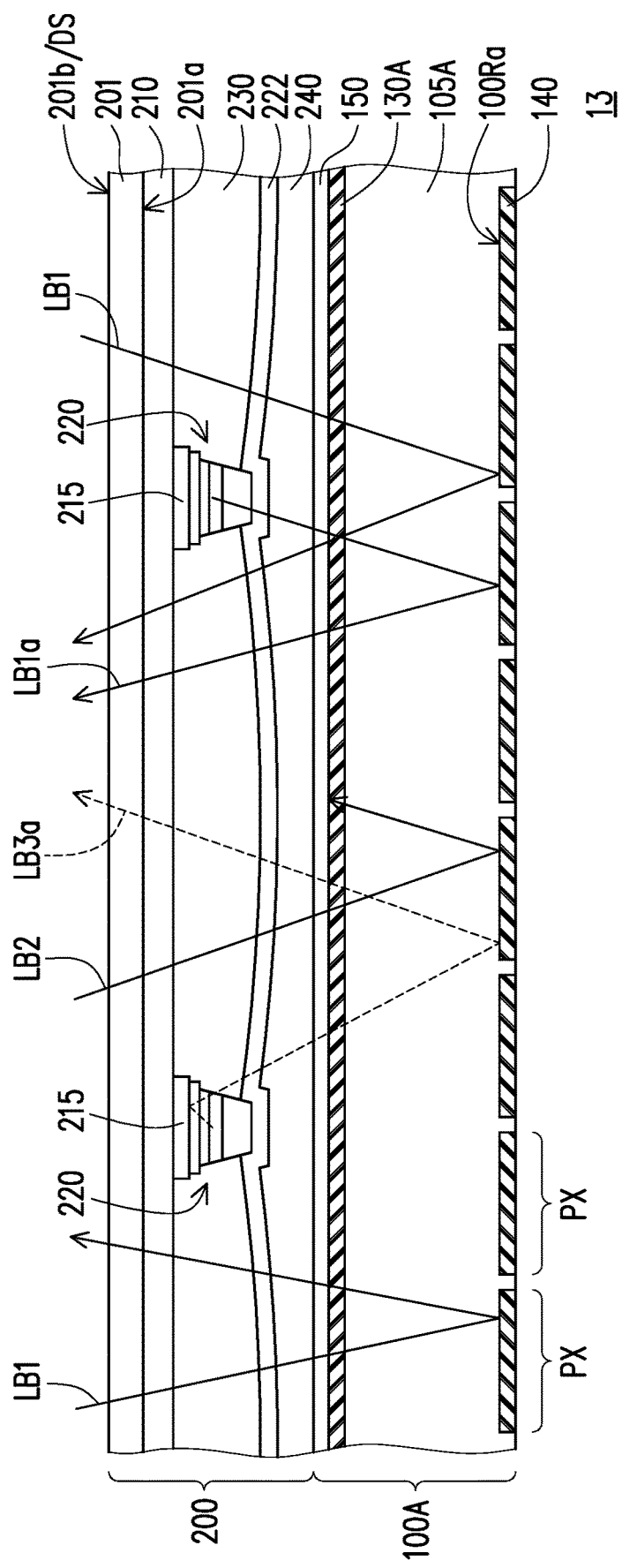
FIG. 7 is a cross-sectional view of a display apparatus according to a sixth embodiment of the disclosure.

FIG. 7 is a cross-sectional view of a display apparatus according to a sixth embodiment of the disclosure. Referring to FIG. 7, a main difference between the display apparatus 13 of the embodiment and the display apparatus 10 of FIG. 2B lies in different compositions of the reflective display panel. In the embodiment, the display medium layer 105A of the reflective display panel 100A may be a liquid crystal layer, which is clamped between the third electrode 130A and the fourth electrode 140. Namely, the reflective display panel 100A of the embodiment is a reflective liquid crystal display panel, and a surface 100Ra of the fourth electrode 140 may define a reflective surface of the reflective display panel 100A. On the other hand, the reflective display panel 100A further includes a polarizer 150 disposed between the third electrode 130A and the micro LED panel 200.

For example, a light beam LB1 and a light beam LB2 coming from external and a light beam LB1a and a light beam LB3a coming from the micro LED devices 220 are polarized after passing through the polarizer 150. Then, theses beams are reflected by the fourth electrode 140 after passing through the display medium layer 105A, and again pass through the display medium layer 105A and are transmitted to the polarizer 150. Now, polarization states of the light beam LB1, the light beam LB1a and the light beam LB3a are not orthogonal to a penetration axis (not show) of the polarizer 150, so that the light beams LB1, LB1a and LB3a may partially (or completely) pass through the polarizer 150; conversely, since a polarization state of the light beam LB2 is orthogonal to the penetration axis of the polarizer 150, the light beam LB2 is absorbed by the polarizer 150.

Figure 8:
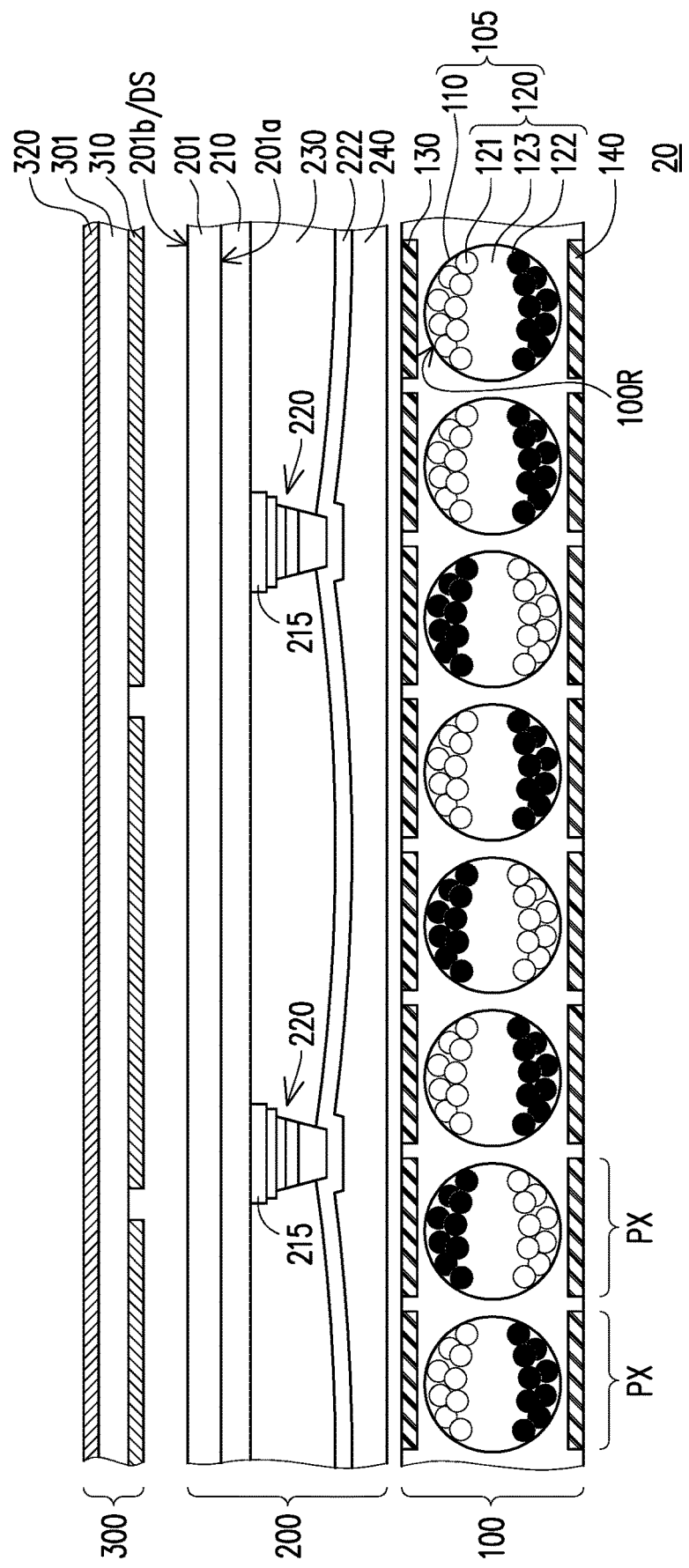
FIG. 8 is a cross-sectional view of a display apparatus according to a seventh embodiment of the disclosure.

FIG. 8 is a cross-sectional view of a partial region of a display apparatus according to a seventh embodiment of the disclosure. Referring to FIG. 8, a main difference between the display apparatus 20 of the embodiment and the display apparatus 10 of FIG. 1 (or FIG. 2A) is that the display apparatus 20 of the embodiment further includes a touch device layer 300. The touch device layer 300 is overlapped with the reflective display panel 100 and the micro LED panel 200, and the micro LED panel 200 is located between the reflective display panel 100 and the touch device layer 300.

In the embodiment, the touch device layer 300 may include a substrate 301 and a driving electrode 310 and a sensing electrode 320 disposed at two opposite sides of the substrate 301, but the disclosure is not limited thereto. For example, the driving electrode 310 and the sensing electrode 320 may be respectively used for transmitting a driving pulse signal and a sensing signal to implement a multipoint touch sensing effect, but the disclosure is not limited thereto. In the embodiment, the driving electrode 310 and the sensing electrode 320 are, for example, light transmissive electrodes, and a material of the light transmissive electrode includes metal oxide, for example, indium tin oxide, indium zinc oxide, aluminum tin oxide, aluminum zinc oxide, or other suitable oxide, or a stacked layer of at least two of the above materials.

Figure 9:
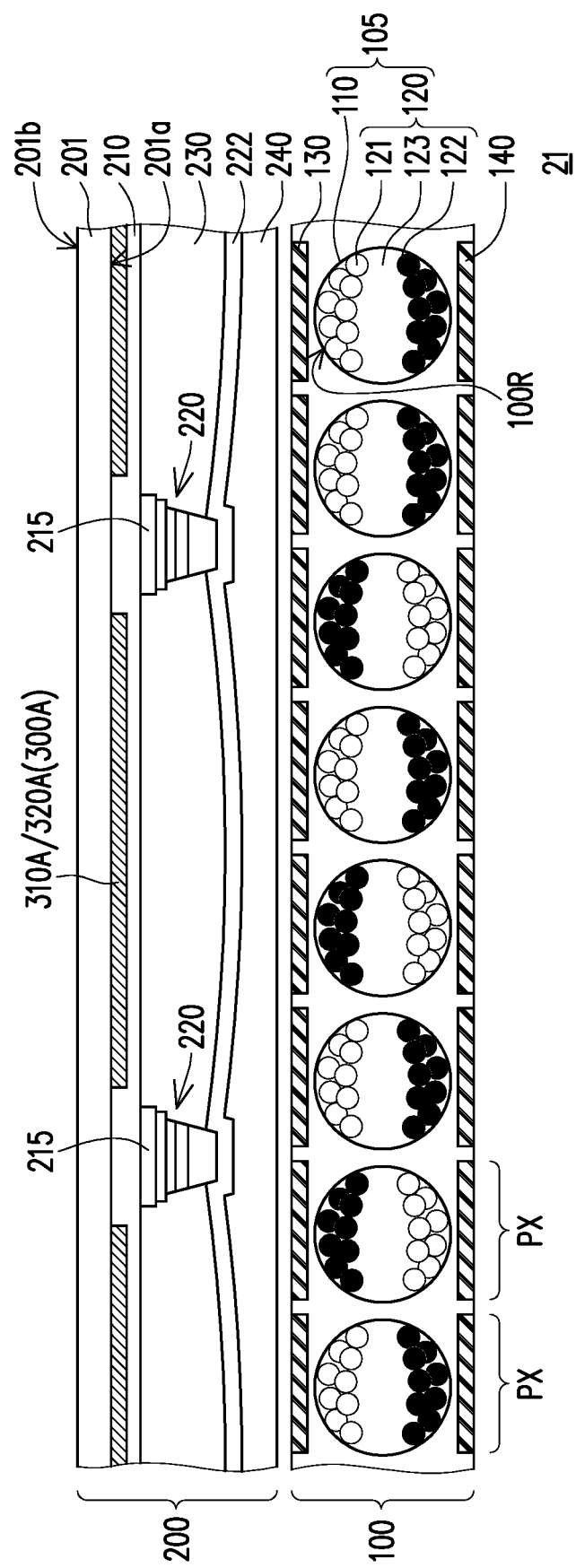
FIG. 9 is a cross-sectional view of a display apparatus according to an eighth embodiment of the disclosure.

FIG. 9 is a cross-sectional view of a display apparatus according to an eighth embodiment of the disclosure. Referring to FIG. 9, a main difference between the display apparatus 21 of the embodiment and the display apparatus 20 of FIG. 8 lies in a different configuration method of the touch device layer. In the embodiment, the driving electrodes 310A and the sensing electrodes 320A of the touch device layer 300A are disposed on the first surface 201a of the substrate 201. The driving circuit layer 210 is located on the touch device layer 300A, and the driving electrodes 310A (or the sensing electrodes 320A) are not overlapped with the micro LED devices 220 in a normal direction of the first surface 201a. In this way, an overall thickness of the display apparatus 21 having a touch function may be further reduced. In the embodiment, the driving electrodes 310A and the sensing electrodes 320A may selectively belong to a same film layer, but the disclosure is not limited thereto.

In summary, in the display apparatus of an embodiment of the disclosure, the flexibility of operation of the reflective display panel is increased because of the configuration relationship between the LED panel and the reflective display panel, which helps to improve the operational adaptability of the display apparatus in different situations. Furthermore, as the transmittance of the LED panel is greater than 50%, the light energy loss of the external environmental light and the light beam reflected by the reflective display panel after passing through the LED panel is effectively reduced, thereby increasing the light energy utilization rate of the display apparatus and improving the overall display quality.

What is claimed is:

1. A display apparatus, having a display surface and comprising:
   a reflective display panel, having a reflective surface; and
   a micro light-emitting diode panel, overlapped with the reflective display panel, configured with the display surface, and comprising:
      a driving circuit layer, positioned between the reflective display panel and the display surface; and
      a plurality of micro light-emitting diode devices, electrically bonded to the driving circuit layer,
   wherein the display surface and the reflective surface are respectively disposed on two opposite sides of the micro light-emitting diode devices, and a visible light transmittance of the micro light-emitting diode panel is higher than 50%,
   wherein the reflective display panel of the display apparatus comprises a plurality of pixel structures, a first spacing is present between any two adjacent micro light-emitting diode devices, a second spacing is present between any two adjacent pixel structures, and the first spacing is a multiple of the second spacing.

2. The display apparatus as claimed in claim 1, wherein the reflective display panel comprises a plurality of pixel structures overlapped with the micro light-emitting diode panel, and the pixel structures are staggered with the micro light-emitting diode devices in a normal direction of the display surface.

3. The display apparatus as claimed in claim 2, wherein the micro light-emitting diode panel further comprises:
   a plurality of pixels, respectively having at least one micro light-emitting diode device, wherein the number of the pixel structures of the reflective display panel is different to the number of the pixels of the micro light-emitting diode panel.

4. The display apparatus as claimed in claim 3, wherein the number of the pixel structures of the reflective display panel is more than the number of the pixels of the micro light-emitting diode panel.

5. The display apparatus as claimed in claim 3, wherein each of the pixels has a red micro light-emitting diode, a blue micro light-emitting diode and a green micro light-emitting diode.

6. The display apparatus as claimed in claim 1, wherein the micro light-emitting diode panel further comprises:
   a plurality of dimming patterns, overlapped with the micro light-emitting diode devices, wherein the micro light-emitting diode devices are located between the reflective display panel and the dimming patterns.

7. The display apparatus as claimed in claim 6, wherein the driving circuit layer comprises:
   a plurality of connection pads, overlapped with the micro light-emitting diode devices, wherein the micro light-emitting diode devices are bonded to the connection pads, and the connection pads are the dimming patterns.

8. The display apparatus as claimed in claim 1, further comprising:
   a touch device layer, overlapped with the reflective display panel and the micro light-emitting diode panel, wherein the micro light-emitting diode panel is located between the touch device layer and the reflective display panel.

9. The display apparatus as claimed in claim 1, wherein the micro light-emitting diode panel further comprises:
   a touch device layer, disposed between the display surface and the micro light-emitting diode devices, and the touch device layer comprises a driving electrode and a sensing electrode.

10. The display apparatus as claimed in claim 9, wherein the micro light-emitting diode panel further comprises a substrate, and the touch device layer is disposed on a first surface of the substrate, and the driving circuit layer is located on the touch device layer.

11. The display apparatus as claimed in claim 10, wherein the substrate of the micro light-emitting diode panel is configured with the display surface, and the display surface is opposite to the first surface.

12. The display apparatus as claimed in claim 1, wherein the micro light-emitting diode panel further comprises a substrate, the driving circuit layer is disposed on a first surface of the substrate, the micro light-emitting diode devices are bonded to the driving circuit layer, and the substrate and the driving circuit layer are located between the reflective display panel and the micro light-emitting diode devices.

13. The display apparatus as claimed in claim 12, wherein the micro light-emitting diode panel further comprises a plurality of dimming patterns overlapped with the micro light-emitting diode devices, and the micro light-emitting diode devices are located between the reflective display panel and the dimming patterns.

14. The display apparatus as claimed in claim 1, wherein the micro light-emitting diode panel provides a light source to the reflective display panel in a light source mode, and the micro light-emitting diode panel serves as a display panel in a display mode.

15. The display apparatus as claimed in claim 14, wherein the micro light-emitting diode panel and the reflective display panel respectively display different images in a hybrid mode.

* * * * *